US009908374B2

United States Patent
Dussinger et al.

(10) Patent No.: US 9,908,374 B2
(45) Date of Patent: *Mar. 6, 2018

(54) TIRE MODULE WITH PIEZO-ELECTRIC TRANSDUCER AND TIRE EQUIPPED THEREWITH

(71) Applicant: Huf Hülsbeck & Fürst GmbH & Co. KG, Velbert (DE)

(72) Inventors: Axel Dussinger, Bad Rappenau (DE); Ralf Kessler, Pfinztal (DE); Ingemar Wolf, Waghaeusel (DE); Andre Seifert, Pforzheim (DE); Benjamin Mueller, Bad Friedrichshall (DE)

(73) Assignee: HUF HÜLSBECK & FÜRST GMBH & CO. KG, Velbert (DE)

(*) Notice: Subject to any disclaimer, the term of this patent is extended or adjusted under 35 U.S.C. 154(b) by 767 days.

This patent is subject to a terminal disclaimer.

(21) Appl. No.: 14/509,240

(22) Filed: Oct. 8, 2014

(65) Prior Publication Data

US 2015/0020585 A1 Jan. 22, 2015

Related U.S. Application Data

(63) Continuation of application No. PCT/EP2013/057446, filed on Apr. 10, 2013.

(30) Foreign Application Priority Data

Apr. 11, 2012 (DE) .......................... 10 2012 007 071
Aug. 17, 2012 (DE) .......................... 10 2012 107 573

(51) Int. Cl.
B60C 23/02 (2006.01)
B60C 23/04 (2006.01)
(Continued)

(52) U.S. Cl.
CPC .......... *B60C 23/04* (2013.01); *B60C 23/0411* (2013.01); *B60C 23/0493* (2013.01);
(Continued)

(58) Field of Classification Search
None
See application file for complete search history.

(56) References Cited

U.S. PATENT DOCUMENTS 6,438,193 B1* 8/2002 Ko ...................... B60C 23/0408
377/15
9,844,985 B2* 12/2017 Mueller .............. B60C 23/0493
(Continued)

FOREIGN PATENT DOCUMENTS

CN 1717338 A 1/2006
DE 60310104 T2 6/2007
(Continued)

*Primary Examiner* — Andre Allen
(74) *Attorney, Agent, or Firm* — Hackler Daghighian Martino & Novak

(57) ABSTRACT

A tire module for attachment to an inside of a pneumatic tire for vehicles includes a device for measuring and/or monitoring the air pressure in the tire. A transmitter for transmitting radio signals, which contains information regarding the air pressure in the tire, includes a mechanical-electrical transducer having a flexible piezo-electrical element, which converts alternating changes in shape of the piezo-electric element caused by the rolling tire into electric energy and includes a storage unit for the electric energy, which is connected to the transducer. The transducer may contain a circular, disc-like, piezo-electric element, which in the following is described as piezo disc and on which an electrical voltage generated through the piezo effect is tapped off on contact points which are located on opposite sides of the piezo disc.

25 Claims, 6 Drawing Sheets

(51) Int. Cl.
    *H01L 41/047*     (2006.01)
    *H01L 41/113*     (2006.01)
    *H02N 2/18*       (2006.01)
    *G01M 17/02*      (2006.01)

(52) U.S. Cl.
    CPC ........... *G01M 17/02* (2013.01); *H01L 41/047* (2013.01); *H01L 41/0475* (2013.01); *H01L 41/0477* (2013.01); *H01L 41/113* (2013.01); *H02N 2/18* (2013.01); *H02N 2/181* (2013.01)

(56) References Cited

U.S. PATENT DOCUMENTS

| | | | |
|---|---|---|---|
| 2007/0295069 A1* | 12/2007 | Mancosu | B60C 23/0411 73/146 |
| 2009/0039733 A1* | 2/2009 | Huovila | B60C 23/0411 310/319 |
| 2010/0126263 A1* | 5/2010 | Brusarosco | B60C 23/0411 73/146 |
| 2010/0186493 A1* | 7/2010 | Brusarosco | H01L 41/1132 73/146.3 |
| 2011/0127881 A1 | 6/2011 | Howarth | |
| 2012/0085160 A1* | 4/2012 | Dussinger | B60C 23/0411 73/146.5 |
| 2014/0070935 A1* | 3/2014 | Wang | B60W 40/06 340/443 |

FOREIGN PATENT DOCUMENTS

| | | |
|---|---|---|
| WO | 95 15577 | 6/1995 |
| WO | 2004030948 A1 | 4/2004 |
| WO | 2008 034825 A1 | 3/2008 |

\* cited by examiner

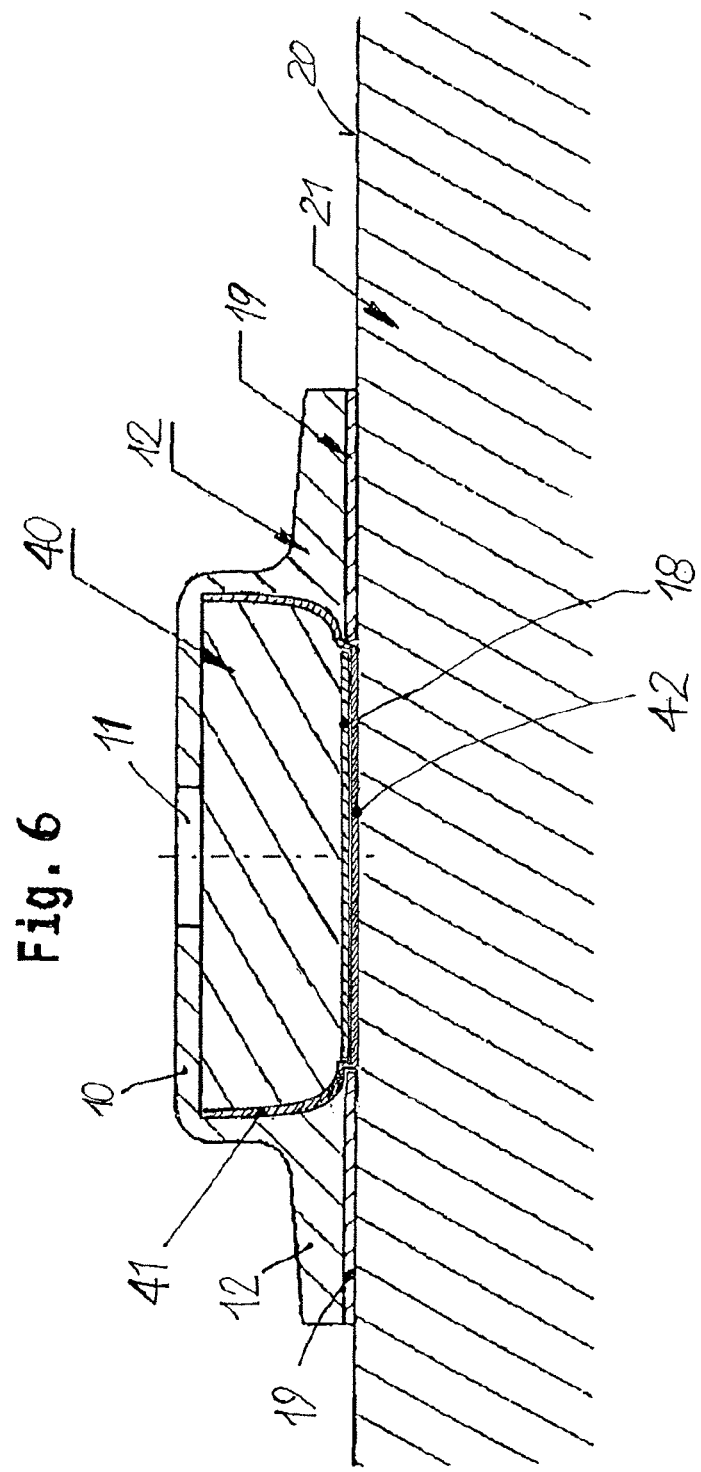

TIRE MODULE WITH PIEZO-ELECTRIC TRANSDUCER AND TIRE EQUIPPED THEREWITH

CROSS-REFERENCE TO RELATED APPLICATIONS

This continuation application claims priority to PCT/EP2013/057446 filed on Apr. 10, 2013 which has published as WO 2013/153088 A1 and also the German application numbers 10 2012 007 071.3 filed on Apr. 11, 2012 and 10 2012 107 573.5 filed on Aug. 17, 2012, the contents of which are fully incorporated herein with these references.

FIELD OF THE INVENTION

The present invention generally relates to monitoring the air pressure inside a pneumatic tire. More particularly, the present invention relates to a tire module inside a pneumatic tire for transmitting radio signals containing information regarding the tire pressure.

BACKGROUND OF THE INVENTION

The invention starts from a tire module which is known from DE 603 10 104 T2 (EP 1 549 515 B1) or the like. The known tire module is attached to the inside of a pneumatic tire for motor vehicles. It contains a device for measuring and/or monitoring the air pressure in the tire and a transmitter for transmitting radio signals which contain information regarding the air pressure in the tire. The electric energy, which the tire module requires, is supplied by a mechanical-electrical transducer with a flexible piezo-electric element, which is exposed to acceleration forces, which with rolling tire are exerted by a seismic mass and change at the beginning and at the end of a passage of the tire module through the contact area of the tire (contact patch). The electric energy generated by the piezo-electric element increases with the size of the seismic mass and with the rotational speed of the tire. The electric energy supplied by the piezo-element is fed to a storage unit, from which it can be taken for operating the device for measuring and/or monitoring the tire pressure and for operating the transmitter. The mechanical-electrical transducer exploiting the piezo effect can replace a long-life battery that is otherwise required in the tire module.

WO 2010/092171 A2, WO 2007/099159 A1 and DE 10 2004 031 810 A1 also disclose tire modules with a piezo-element, which is subjected to forces with which centrifugal accelerations act on a seismic mass which is connected to the piezo-element. US 2007/0074566 A1 discloses a tire module with a piezo-element, which generates electric energy from the tire pressure fluctuations that occur.

It may be one of many objects of the present invention to provide a tire module that can be particularly easily mounted and which may be autonomous with respect to its power supply.

This object may be solved by a tire module with the features stated in the independent claims. A further subject of the invention is a tire which is equipped with such a tire module. Advantageous further developments of other embodiments of the invention may be the subject of the dependent claims.

SUMMARY OF THE INVENTION

The tire module according to the invention has a device for measuring and/or monitoring the air pressure in the tire, a transmitter for transmitting radio signals, which contain information regarding the air pressure in the tire, a mechanical-electrical transducer with a flexible piezo-electric element, which converts alternating deformations of the piezo-electric element caused by the rolling tire into electric energy and a storage unit for the electric energy, which is connected to the transducer. The transducer contains a circular, disc-shaped, piezo-electric element, which hereinafter is described as piezo disc and on which an electrical voltage generated by the piezo effect can be tapped off at contact points which are located on opposite sides of the piezo disc.

The tire module according to the invention may have (but which are not necessary) substantial advantages:

By using a circular, disc-shaped piezo-electric element the tire module, which is practically arranged so that the center axis of the circular piezo disc is orientated perpendicularly to the running surface of the tire and thus radially with respect to the axis of rotation of the tire, can otherwise be fastened on the inside of the tire in any orientation. Rotations of the tire module about the center axis of the circular piezo disc remain without noteworthy influence on the efficiency of the mechanical-electrical transducer.

The use of a circular piezo disc allows using a flat, cylindrical housing for the tire module, the diameter of which is orientated towards the diameter of the piezo disc. This makes possible a particularly compact construction of the tire module with minimal mass.

Minimal mass means minimal unbalance and minimal forces of inertia, which in turn favor a long lifespan.

A tire module with flat, cylindrical housing can be particularly easily handled and easily and durably fastened to the inside of the tire.

Practically, the tire module is fastened to the inside of the tire in the region of the running surface. Incorrect arrangement of the tire module according to the invention is not possible there.

Even with a slowly rotating tire the tire module supplies sufficient energy for the tire pressure check, because the generation of the piezo voltage does not depend on a centrifugal acceleration acting on a seismic mass.

The circular, disc-shaped, piezo-electric element in one embodiment consists of a piezo ceramic, e.g. from lead zirconate titanate. The piezo-electric element however can also be formed by coating a substrate, in particular a metallic substrate, with a piezo-electric material. In this case, the substrate serves as carrier for the piezo-electric material. For both embodiments, the term "piezo disc" is used in this patent specification. The piezo disc is mounted in the tire so that changes in shape of the running surface of the tire generate changes in shape of the piezo disc which occur in particular at the entry of the contact patch and the exit of the contact patch. The alternating changes in shape generate an electrical voltage on the piezo disc which can be tapped off at contact points which are located on opposite sides of the piezo disc.

One of the contact points, which is used for tapping off the electric voltage, may be formed by a metal disc, in particular in one embodiment by a circular metal disc, which completely covers a first side of the piezo disc. (The metal disk may also be non-circular such that it has many edges that approximate a circular shape, such as 6, 8, 10 or any number of edges.) The metal disc is so thin and flexible that it allows the desired bending of the piezo disc during the passage through the contact patch and protects the piezo-electric material, in particular against fracture. The metal disc can form an outside of the tire module so that the tire module after its fastening on a tire with its metal disc contacts the inside of the tire. This has the advantage that the deformations of the tire that occur there are directly transmitted to the metal disc and from the latter to the piezo disc. In the embodiment, in which a metallic substrate is coated with piezo-electric material, the metallic substrate can be used as the one contact point of the piezo disc. A separate metal disc is dispensable in this case in order to form an electrical contact point. Following the fastening of the tire module on the tire the metallic substrate or a metal disc, which forms one of the two electrical contact points, can directly contact the inside of the tire or can be separated from the inside of the tire through an intermediate layer which is so thin and flexible that the deformation of the inside of the tire that occurs during the passage through the contact patch is transmitted onto the piezo disc, causing the latter to generate the electric energy that is sufficient for operating the tire module.

The metal disc, which completely covers a first side of the piezo disc and is utilized as an electrical contact point, may have a slightly larger diameter than the piezo disc.

The second side of the piezo disc may be provided only partially with one or multiple contact points. This facilitates ensuring that the composite body formed of the piezo disc, the contact-providing metal disc on the first side of the piezo disc and by the electrical contact material on the second side of the piezo disc has a neutral fiber which during the bending of the piezo disc is not located in the middle of the piezo disc but at the edge of the piezo disc or even in the metal disc. This is significant for a good efficiency of the mechanical-electrical transducer on piezo basis.

On the second side of the piezo disc, multiple contact points may be provided which are connected to one another in an electrically conductive manner. This ensures that the mechanical-electrical transducer does not already fail when one of the contact points should become detached from the piezo disc. The one or the multiple contact points on the second side of the piezo disc may be arranged in the middle on the piezo disc and practically cover not more than 20%, or in another embodiment a maximum of 10% of the second side of the piezo disc.

The piezo disc may be arranged between the metal disc on the first side of the piezo disc and a flexible conductor path film on the second side of the piezo disc. On the flexible conductor path film conductor paths are located which lead to the contact points on the second side of the piezo disc and likewise connect these with one another and with the storage unit for the electric energy provided in the tire module. The conductor path film can also comprise a conductor path which establishes the electrical connection between the metal disc on the first side of the piezo disc and the storage unit for the electric energy. The connection between the conductor paths and the metal disc on the first side of the piezo disc and the contact points on the second side of the piezo disc can be established for example through reflow soldering. Here, multiple soldering points can be formed between the metal disc and the conductor path of the conductor path film to be connected to the same for safety reasons. In one embodiment, the conductor path, which establishes the connection with the circular metal disc, runs along the edge of the circular disc and extends almost over the entire circumference of the circular disc.

The conductor path film—like a printed circuit board—can comprise conductor paths on both sides of the conductor path film. This is a possibility in order to electrically insulate the conductor path, which leads to the first side of the piezo disc, from the conductor paths, which lead to the contact points on the second side of the piezo disc. However, the conductor paths can also run on one and the same side of the conductor path film. Insofar as these run over an edge region of the circular metal disc, they can be insulated there from one another by an electrically insulating varnish.

The metal disc is to adhere to the disc of piezo-electric material. This can be effected for example with the help of a conductive adhesive. A conductive adhesive is an adhesive in which electrically conductive pigments are distributed, which impart electrical conductivity to the adhesive. When the metal disc is connected in a fixed manner to the ceramic piezo disc through gluing or in another way it is sufficient if the ceramic piezo disc is mainly polarized in one direction so that during the bending of the composite of the ceramic piezo disc and the flexible metal disc a utilizable electrical voltage is generated through the piezo effect. Without the composite with a flexible metal disc, a composite of at least two ceramic piezo discs which are polarized in opposite directions would be required in order to generate a utilizable electrical voltage through the piezo effect during bending.

The conductor path film, which covers the first side of the piezo disc, may form a circular area which is connected to a circuit substrate through a web, which likewise may consist of the conductor path film and originates from the edge of the circular area. The circuit substrate may likewise consists of the conductor path film so that it and the circular area, which covers the first side of the piezo disc, can be formed in one piece from the flexible conductor path film. This may be favorable for an easy, cost-effective compact construction of the tire module. The construction is compact in particular when the two circular areas, which may coincide in diameter, are arranged on top of one another and may be coaxial to one another subject to intermediate inserting of a stiff spacer disc, possibly a rigid spacer disc, which may be likewise circular. The two circular areas can be brought into this position in that the conductor path film in the region of the web subject to the intermediate inserting of the spacer disc is folded about the latter. The piezo disc, the spacer disc and the part of the conductor part film which forms the circuit substrate and is assembled with the components and circuit parts of the tire module are arranged particularly compact on top of one another in this manner and can be received by a housing with a cylindrical outer surface, wherein the diameter of the outer surface of the housing is orientated towards the diameter of the piezo disc and the slightly larger metal disc, which carries the piezo disc.

On its side facing the piezo disc, the spacer disc may be convexly curved. This has at least one advantage that in this way a free space is formed in which the edge of the piezo disc can be bent into. The size of this free space is practically so selected that the bent piezo disc contacts the convex side of the spacer disc facing it before it can break.

Practically, the components of the tire module, with the exception of the free space between the convex side of the spacer disc and the circular area facing it and with the exception of the side of the metal disc facing away from the piezo disc, are embedded in an electrically insulating casting compound. The casting compound protects the components of the tire module from dust and in particular against the entering of moisture. In order to prevent that the casting compound enters the free space between the convex side of the spacer disc and the side of the conductor path film facing it, a sealing ring, which may have a rectangular cross section, is provided between the spacer disc and the circular area formed by the conductor path film, which faces the piezo disc. The sealing ring may consist of a compressible foam material.

When the casting compound following the encasing through casting of the components of the tire module has solidified, it may have a substantially cylindrical circumferential surface. "Substantially" in this case is to mean that the shape of the circumferential surface can deviate from the ideal cylindrical shape in order to enable de-molding of the cast tire module, if casting takes place in a casting mold from which the module has to be removed following the solidification of the casting compound and if the casting mold is not suitable as a "lost" mold. For de-molding, a slight taper of the casting mold facilitating de-molding is practical.

A cap may be provided into which the grouted tire module is inserted. On its edge, this cap may have a flange facing towards the outside, with which the cap can be fastened to the inside of the tire. The cap is practically a pre-fabricated molded part. In order for it to receive the cast tire module without play, the circumferential surface of the casting compound of the tire module may have an oversize with respect to the clear width of the empty cap so that the cap is slightly stretched when the tire module is inserted into it. In one embodiment, the height of the tire module with respect to the clear height of the cap also has an oversize, so that the cap is also slightly stretched in the height when it is fastened with the inserted tire module on the inside of the tire. This fastening can take place in different ways, e.g. in that the flange of the cap is vulcanized on the inside of the tire, in particular cold vulcanized. Another possibility consists in gluing the flange of the cap to the inside of the tire, e.g. with a hot melt.

The cap practically may consist of an elastomer material, in particular of a material on the basis of rubber.

The cast tire module may be inserted into the cap together with the casting mold, in which the tire module is cast. The casting mold in this case is a "lost" mold. For it to be suitable for this purpose it may be designed as a tub that has a base that is arranged so that, when the tire module is mounted to a tire, it contacts the inside of the tire and which is so thin that it follows the deformation of the inside of the tire transmitting the deformation to the piezo disc while the latter with rolling tire moves past the contact patch of the tire. The tub may consist of a plastic foil and is practically formed from the plastic foil through deep drawing or through hot forming. The use of the casting mold as a lost mold has multiple advantages: following the casting, the tire module has an exactly defined shape and for the top a material can be selected which does not adhere to the inside of the tire but during the alternating deformations of the tire slides on the inside of the tire.

When the tire module is to have a device for measuring the air pressure in the tire, the air in the tire has to have access to the interior of the tire module. It is known to provide an integrated circuit for measuring the air pressure in the tire, in which an electric pressure sensor, in particular on silicon basis, is integrated. Such an integrated circuit has an aperture, which makes possible the access of the pressurized air to the pressure sensor, wherein this aperture may contain a filter element to protect from dirt. By way of such an aperture, access is to be left open both in the casting compound and also in the cap via which the pressure sensor is in connection with the compressed air in the tire. However, the pressure sensor need not be a part of an integrated circuit, it can also be attached on the conductor path film as an independent component.

In one embodiment, the tire module does not only contain a transmitter with a transmitter aerial but also a receiver with a receiver aerial. Whereas the transmitter usually transmits with frequencies above 100 MHz, the receiver in the tire module may be designed for a substantially lower frequency, in particular for a frequency of 125 KHz. By this receiving aerial, signals can be received which transport information, e.g. signals for adjusting and/or programming a control circuit that is provided in the tire module, which can for example be a microprocessor, a microcontroller or an ASIC. By way of this receiving aerial, signals can also be received which contain data characterizing the tire proper, e.g. by type and year of manufacture and which characterize the tire module, e.g. by an individual identifier, namely a code, which is sent along every time the tire module emits a signal, so that the recipient of this signal can determine with the help of the co-transmitted identifier, from which tire module the signal originates.

However, by way of the low-frequency receiving aerial of the tire module electric energy transmitted by radio for charging the storage unit in the tire module can also be received. This may be advantageous when the vehicle has been stationary so long that the storage unit for electric energy provided in the tire module is discharged. Thus, the storage unit can be charged during maintenance operations in a workshop where it is not possible to charge the storage unit with the piezo-electrically operating mechanical-electrical transducer.

BRIEF DESCRIPTION OF THE DRAWINGS

The accompanying drawings illustrate the invention. In such drawings:

FIG. 6 shows a simplified section through a tire module, which as integral part comprises a tub as lost casting mold.

DETAILED DESCRIPTION OF THE PREFERRED EMBODIMENTS

Figure 1:
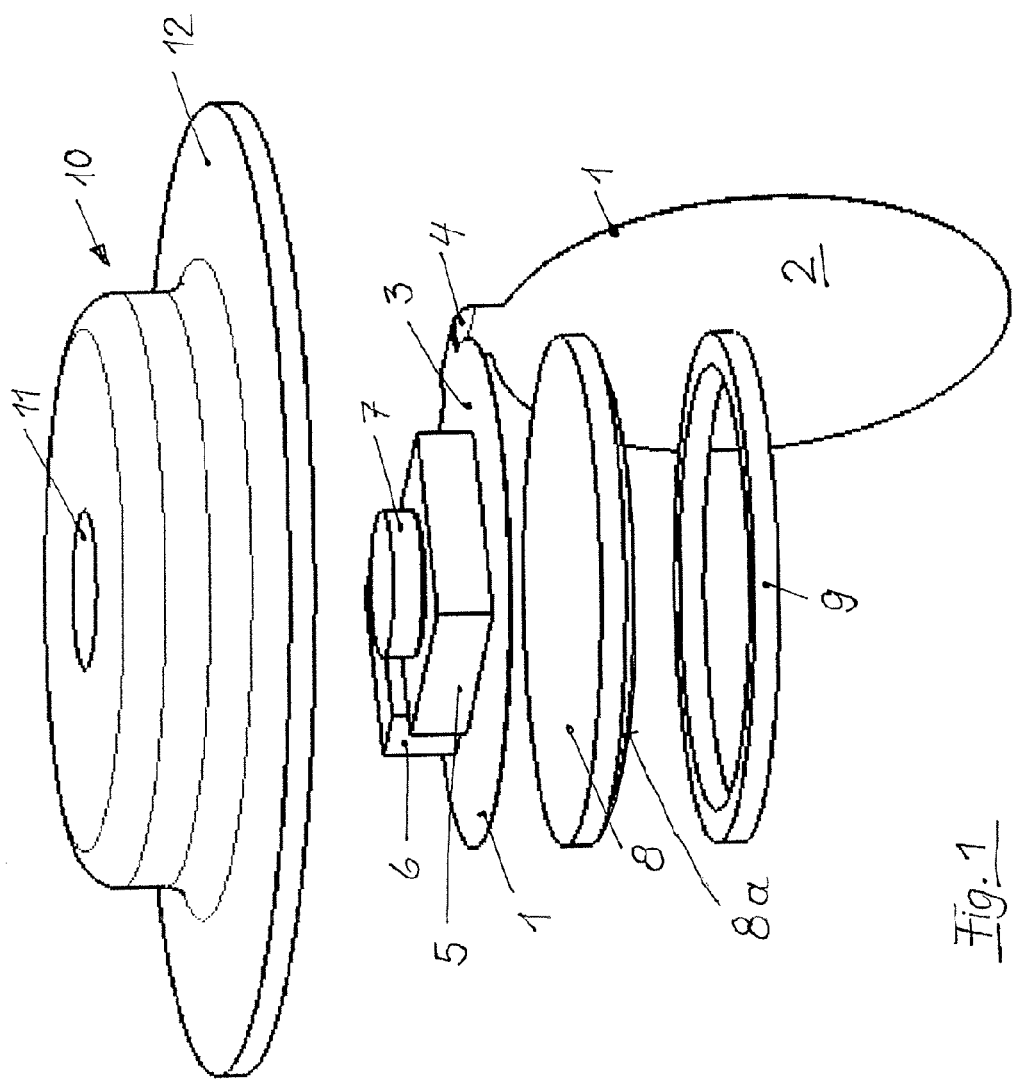
FIG. 1 shows a tire module according to the invention in an exploded representation, namely in an oblique view, together with a cap, which is to receive the tire module.

FIG. 1 shows a flexible conductor path film 1, which forms a first circular area 2, a second circular area 3 and a web 4, which unitarily connects the two circular areas 2 and 3 with one another. The circular area 3 is a circuit substrate, on which, only shown exemplarily and schematically, an integrated circuit 5 and a further electrical component 6 are arranged. This merely serves to show that the circuit substrate 3 carries electrical and electronic components. The integrated circuit (IC) 5 contains a pressure sensor in its housing. For this purpose, the housing of the IC 5 has an aperture 14, see FIG. 2, which is covered by a filter 7.

Below the circuit substrate 3, a circular disc 8 of a rigid plastic is arranged, the lower side 8a of which is convexly curved. Below the plastic disc 8, a compressible sealing ring 9 is provided, the profile of which has a rectangular cross section. For assembling the tire module, the circuit substrate 3, which is assembled with the electrical and electronic components, is placed onto the top side of the plastic disc 8. The sealing ring 9 is placed onto the lower side of the plastic disc 8 and the circular area 2 of the conductor path film 1 is pivoted upwards against the sealing ring 9, as a result of which between the convex lower side 8a of the plastic disc 8 and the circular area 2 a closed-off free space 16 that is delimited by the sealing ring 9 is created. On the lower side of the circular area 2 which is not visible in FIG. 1 are located a piezo disc 17 and below that a metal disc 18, see FIGS. 2 and 3.

The components of the tire module are cast in with a casting compound 13 and following their solidification are inserted into a cap 10 en bloc, which in its top side has an aperture 11, into which the filter 7 engages. The cap 10 has an edge 12 projecting to the outside, with which it can be fastened to the inside 20 of a tire 21, see FIG. 3.

Figure 2:
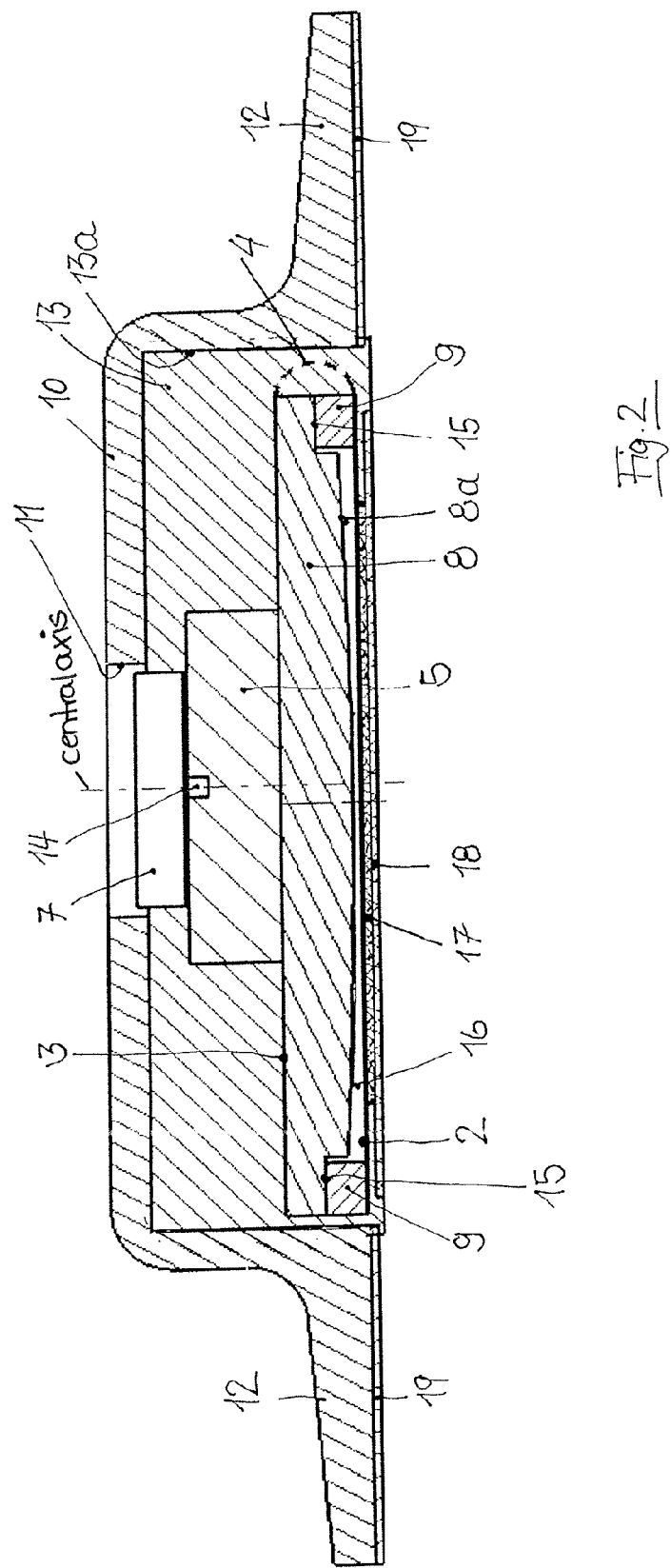
FIG. 2 shows the tire module from FIG. 1, embedded in a casting compound and inserted into the cap, in a simplified section through the center axis of the cap.

FIG. 2 shows how the tire module cast with the casting compound 13 sits in the cap 10. The solidified casting compound 13 has a substantially cylindrical circumferential surface 13a, which with respect to the clear width of the empty cap 10 has an oversize, so that the cap 10 receives the tire module subject to mechanical preload. In order for the cap 10 to be able to stretch, it consists of an elastomer material, in particular on a rubber basis.

Of the components on the circuit substrate 3, merely the IC 5 is visible in FIG. 2. Further components have neither been drawn in for the sake of simplification. In the housing of the IC 5, the position of the aperture 14 is indicated, through which the compressed air that is present in the tire can be admitted to the pressure sensor that is provided for example in the IC 5.

It is visible in the sectional representation of FIG. 2 that the lower side of the plastic disc 8 on the edge is provided with an annular shoulder 15, on which the sealing ring 9 lies. The sealing ring 9 is a radial boundary of the free space 16, which is located between the plastic plate 8 and the first circular area 2 of the conductor path film 1 located below. On the lower side of the first circular area 2, a piezo disc 17 is arranged, which preferentially consists of a piezo ceramic. Below the piezo disc 17, a circular metal disc 18 is fastened. The metal disc 18 may in one embodiment consist of a nickel-iron-alloy with 42% by weight of nickel. It can for example be glued to the piezo disc 17 by means of a conductive adhesive. A conductive adhesive is an adhesive containing electrically conductive pigments, which impart electrical conductivity to the adhesive.

The diameter of the metal disc 18 is greater than the diameter of the piezo disc, but not greater than the diameter of the two circular areas 2 and 3.

Figure 3:
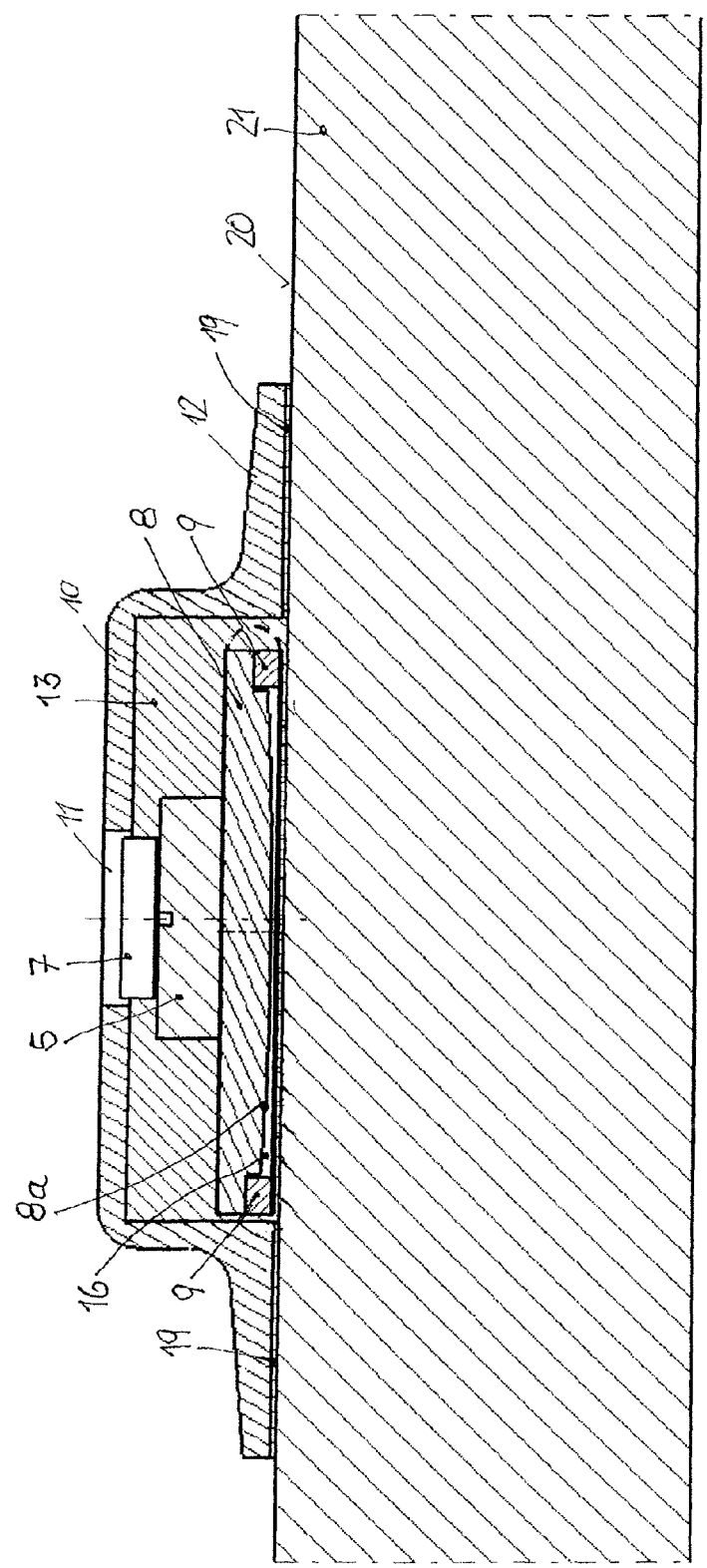
FIG. 3 shows the tire module in a simplified section as in FIG. 2, fastened to the inside of a tire.

On the lower side of the flange 12 of the cap 10, a bonding agent 19 is provided, e.g. a hot melt. With the latter, the cap 10 can be glued together with the inserted tire module, as shown in FIG. 3, onto the inside 20 of a tire 21 which is only shown schematically and in the form of a detail. An alternative fastening possibility is vulcanising the flange 12 onto the inside 20 of the tire 21.

FIG. 3 shows that the tire module including the hardened casting compound 13, into which it is embedded, in height has a slight oversize with respect to the clear height of the cap 10 and in the diameter has a slight oversize with respect to the inner diameter of the cap 10. When connecting the flange 12 to the inside 20 of the tire 21, the tire module is pressed into the cap 10 subject to stretching the same and is held therein free of play on all sides. At the same time, the metal disc 18, through the oversize in the height, is pressed against the inside 20 of the tire 21. The metal disc 18 is so thin and flexible that it adapts to the curvature of the inside 20 of the tire 21. When the contact patch of the tire 21 passes through the region in which the tire module is attached to the tire 21, the curvature of the inside 20 of the tire 21 changes under the metal disc 18 and with it changes the curvature of the metal disc 18 and of the piezo disc 17, as a result of which a piezo voltage is generated.

Figure 4:
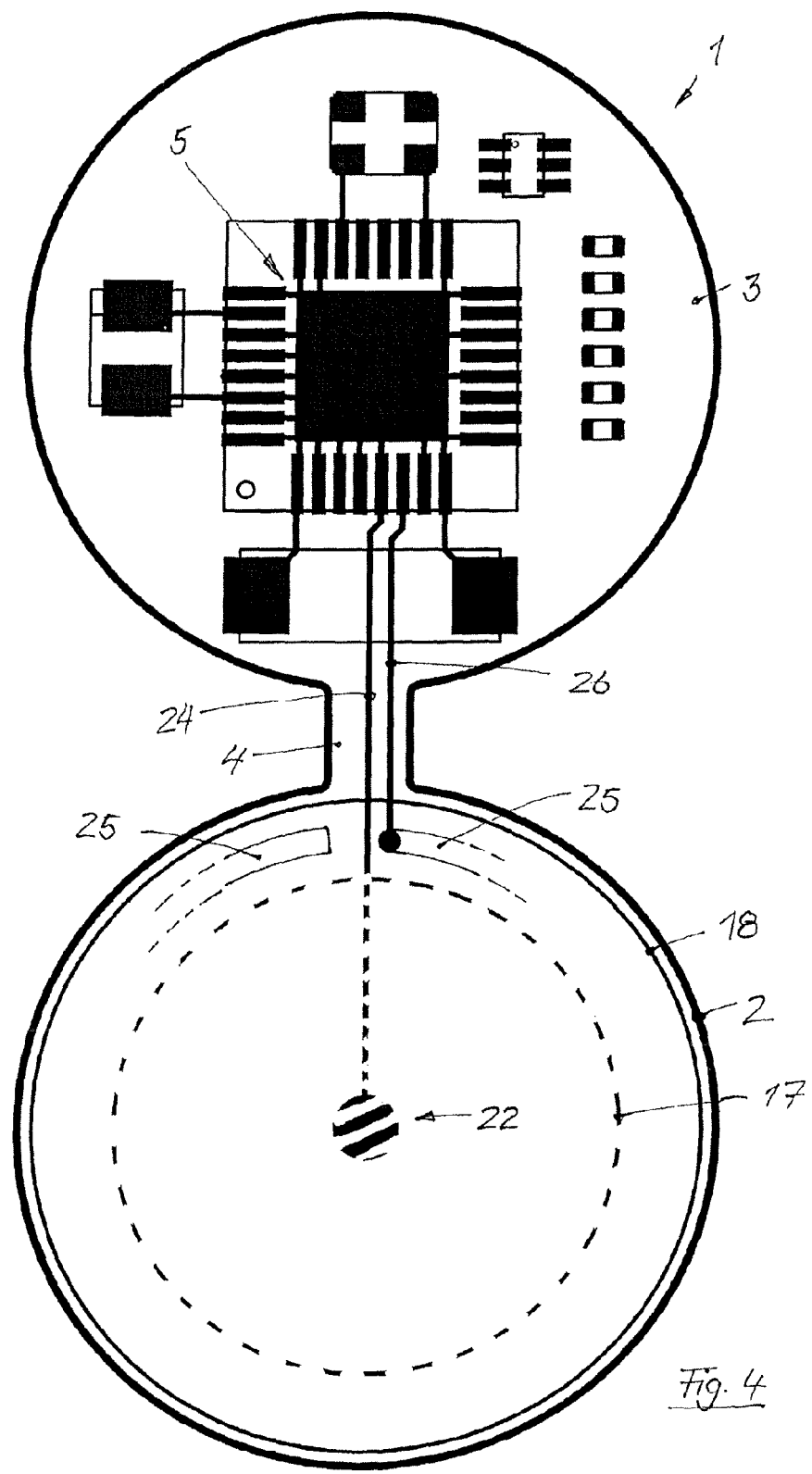
FIG. 4 shows a top view of the folded-open conductor path film assembled with components of the tire module.

FIG. 4 shows the folded-open conductor path film 1, which forms the first circular area 2 and the second circular area 3, which are connected to one another in one piece by the web 4. The conductor path film 1 is flexible and is therefore also called a flex film. On the circular area 2 the piezo disc 17 is arranged. The piezo disc 17 is covered by the circular metal disc 18 and therefore only drawn in dashed lines. The piezo disc 17 and the metal disc 18 are arranged coaxially to the circular area 2. The diameter of the metal disc 18 is only slightly smaller than the diameter of the circular area 2. The diameter of the piezo disc 17 is smaller than the diameter of the metal disc 18.

The metal disc 18 is connected to the piezo disc 17 for example by means of an electrically conductive adhesive and with the first side of the piezo disc 17 establishes a full-area electrical contact. The second side of the piezo disc 17 is electrically contacted with the help of the conductor path film 1. In the middle region of the piezo disc 17, a contact point 22 is arranged. Instead of the one contact point 22, multiple contact points can also be arranged in the middle region of the piezo disc 17, which are interconnected by conductor paths of the conductor path film 1 and are jointly connected to an input of the integrated circuit 5 through a conductor path 24 of the conductor path film 1. The metal disc 18 is soldered to a conductor path 25 along an arc of a circle, which runs in the vicinity of the edge of the metal disc 18 and extends over a circumferential angle of slightly less than 360° and is connected to a further input of the integrated circuit 5 through a conductor path 26 of the conductor path film 1. In this way, the piezo voltage that occurs on the piezo disc 17 is transmitted to the integrated circuit 5 and—not shown in FIG. 4—via a rectifier 28 to a capacitor or similar storage unit 30 for electric energy, see FIG. 5.

On the metal plate 18, the two conductor paths 24 and 26 are insulated from one another by an electrically insulating varnish.

The components shown on the circular area 3 of the conductor path film 1 are merely shown schematically and without their functional connections, merely in order to show that the circular area 3 is a circuit substrate.

Figure 5:
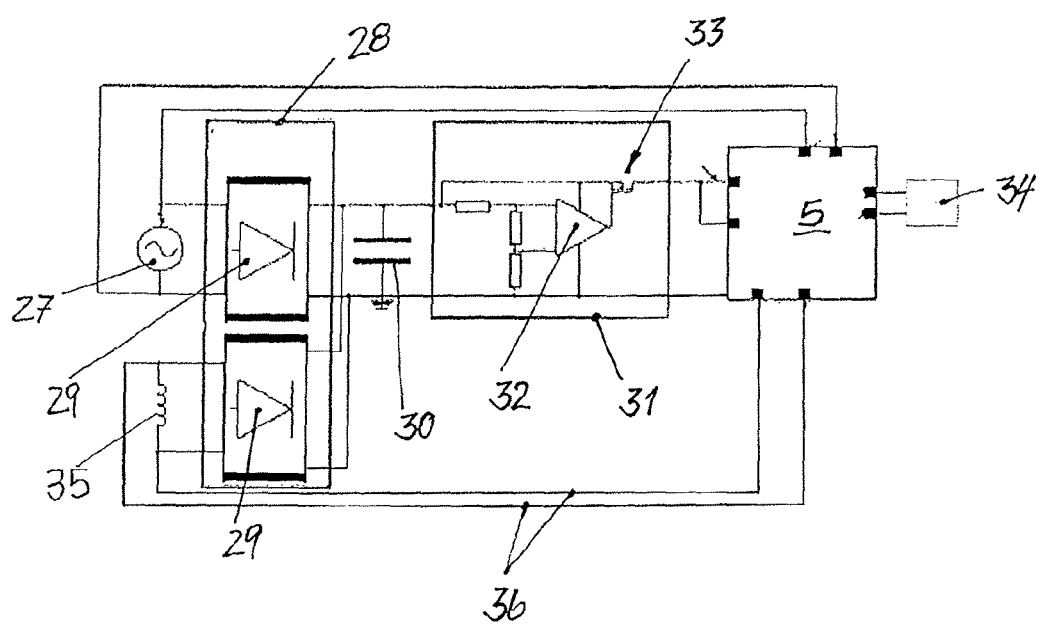
FIG. 5 shows a simplified block diagram of the electrical circuit accommodated in the tire module.

FIG. 5 is a simplified circuit diagram of the tire module. It shows the piezo-electrically operating mechanical-electrical transducer 27, substantially consisting of the piezo disc 17, the metal disc 18 on the one side and the circular area 2 of the conductor path film 1 on the other side of the piezo disc 17. The transducer 27 is connected on the one side directly with two inputs of the integrated circuit 5 and on the other side with a rectifier 28, which contains multiple diodes, e.g. eight diodes, of which two diodes 29 are shown. The rectifier 28 feeds a storage unit 30 for electric energy, which in the present case is a capacitor. The storage unit 30 is connected to the integrated circuit 5 via a control circuit 31, which controls the power management unit PMU. The control circuit 31 contains a comparator 32, which compares the charge state of the storage unit 30 with a limit value and—on exceeding the limit value—supplies the integrated circuit 5 with current via a field effect transistor 33. The integrated circuit 5 among other things contains a pressure sensor and controls a transmitter 34, which emits high-frequency signals, which have information content made available by the integrated circuit 5, e.g. information regarding the tire pressure, an identifier, details regarding the tire, its running performance etc. These signals can be transmitted for example with a frequency of 433 MHz.

The circuit furthermore contains a receiving aerial, in particular a magnetic aerial, shown as a winding 35, which is receptive to relatively low-frequency signals, for example to signals of 125 KHz. On the one hand, these signals can be used in order to transmit control signals and data to the integrated circuit 5, for the purpose of which the winding 35 is connected via leads 36 to two inputs of the integrated circuit 5. The low-frequency signals received by the winding 35 however can also be used in order to charge the storage unit 30. In this case, the signals are fed to the rectifier 28.

The storage unit 30 is so dimensioned that its charge is sufficient for multiple measurement and transmitting operations when it has been completely charged. The measurement and transmitting operations can for example be triggered every time when the charge state of the storage unit 30 exceeds a predetermined limit value. Since the mechanical-electrical transducer 28 makes available a certain charge quantity for the storage unit 30 with each wheel revolution more frequent measuring and transmitting is possible with increasing speed in this way. The frequency of the measuring and transmitting operations however can be limited by the integrated circuit 5 when the charge state is low in order not to measure and transmit unnecessarily frequently.

During slow driving or in the stationary state, when the limit value of the charge state is undershot, the control circuit 31 can switch off the integrated circuit 5. When the charge state of the storage unit 30 again exceeds the predetermined limit value of the charge state of the storage unit 30, the integrated circuit 5 can be reactivated and resume its measuring and transmitting operations.

The mechanical-electrical transducer 27 supplies two prominent electrical impulses of different polarity during each passage of the contact patch of the tire. From this, the integrated circuit 5 can distinguish between stationary state and travel and can detect the speed of the vehicle. At higher speeds, the storage unit 30 is supplied with so much electric energy that not only the tire pressure can be regularly, e.g. every ten seconds, measured and transmitted, but characteristic data of the tire can also be additionally transmitted, in particular a tire identification, a tire type and a cumulative number of revolutions as a measure for its mileage.

From the time interval of the two prominent impulses which are generated during the passage through the contact patch, the length of the contact patch can be determined. This is an important safety aspect since the contact patch length does not only depend on the degree of inflation of the tire, but also on the loading of the vehicle. With increasing load, the length of the contact patch increases. An impermissibly high load can be detected by evaluating the measured contact patch length and can be signaled to the driver. Determining the contact patch length is also of importance since it contributes to the wear to which the tire is subjected.

In the exemplary embodiment shown in FIG. 6, the same or corresponding parts are marked with the same reference numbers as in the preceding figures.

The exemplary embodiment shown in FIG. 6 differs from the preceding exemplary embodiments in that the tire module 40 has a tub 41, which receives all remaining components of the tire module 40, which for the sake of simplicity are not shown individually. The tub 41 can be molded from a plastic foil, e.g. from a polycarbonate. Its bottom 42 is so thin that it follows deformations of the running surface of the tire 21, on the inside 20 of which the bottom 42 of the tub 41 lies when the tire module 40 is fastened to the tire 21, so that deformations of the inside 20 of the tire 21 are transmitted to the mechanical-electrical transducer formed with the piezo disc 17. This ensures that the mechanical-electrical transducer generates electric energy which can be stored in the tire module 40 for the operation of the latter. The tub 41 is not glued to the inside 20 of the tire 21. By contrast it is so that the base 42 of the tub 41 can slide on the inside 20 of the tire 21 during deformations of the tire 21. For this purpose it is favorable to select a material for the tub 41 which with respect to the predetermined inside 20 of the tire 21 has as low as possible a coefficient of adhesive friction and a coefficient of sliding friction. Such a tub 41 can also be used in the other embodiments of the tire module according to the invention.

NUMERALS

1. Conductor path film
2. First circular area
3. Second circular area, circuit substrate
4. Web
5. Integrated circuit with pressure sensor
6. Component
7. Filter
8. Spacer disc of plastic
8a. Lower side of 8, convex side
9. Sealing ring
10. Cap
11. Aperture in 10, access
12. Flange
13. Casting compound
13a. Circumferential surface of 13
14. Aperture in 5, access
15. Annular shoulder
16. Free space
17. Piezo disc
18. Metal disc
19. Bonding agent
20. Inside of the tire
21. Tire
22. Contact point
24. Conductor path
25. Conductor path
26. Conductor path
27. Transducer
28. Rectifier
29. Diodes
30. Storage unit
31. Control circuit
32. Comparator
33. Field effect transistor
34. Transmitter
35. Winding, receiving aerial
36. Lead
40. Tire module
41. Tub
42. Bottom of tub Although several embodiments have been described in detail for purposes of illustration, various modifications may be made to each without departing from the scope and spirit of the embodiments of the invention. Accordingly, the invention is not to be limited, except as by the appended claims.

What is claimed is:

1. A tire module for attaching to an inside of a pneumatic tire for motor vehicles, the tire module comprising:

a pressure sensor configured for measuring and/or monitoring the air pressure in the tire;

a transmitter for transmitting radio signals, the radio signals containing information regarding the air pressure in the tire, the transmitter connected to the pressure sensor;

a mechanical-electrical transducer with a flexible, circular, disc-shaped piezo-electric element, which converts alternating changes in the shape of the piezo-electric element caused by the rolling tire into electric energy, hereinafter described as a piezo disc, and on which an electrical voltage generated through the piezo effect is tapped off at contact points; and a storage unit for the electric energy, which is connected to the transducer and powering the pressure sensor and transmitter;

wherein the contact points are located on opposite sides of the piezo disc.

2. The tire module of claim 1, wherein a contact point is formed through a circular metal disc, which completely covers a first side of the piezo disc and is so thin and flexible that it can transmit deformations of the tire which occur during the passage of the tire module through the contact patch of the tire to the piezo disc.

3. The tire module of claim 2, wherein the metal disc has a larger diameter than the piezo disc.

4. The tire module of claim 1, wherein the second side of the piezo disc is only partially provided with at least one contact point or with a plurality of contact points, which are connected to one another in an electrically conductive manner.

5. The tire module of claim 4, wherein the at least one or the plurality of the contact points are arranged in the middle on the second side of the piezo disc.

6. The tire module of claim 4, wherein the at least one or the plurality of the contact points on the second side of the piezo disc cover a maximum of 20% of the surface of the second side of the piezo disc.

7. The tire module of claim 4, wherein the at least one or the plurality of the contact points on the second side of the piezo disc cover a maximum of 10% of the surface of the second side of the piezo disc.

8. The tire module of claim 1, wherein the piezo disc is arranged between the metal disc on the first side and a flexible conductor path film on the second side of the piezo disc.

9. The tire module of claim 8, wherein the metal disc adheres to the piezo disc.

10. The tire module of claim 8, wherein the conductor path film, which covers the first side of the piezo disc, forms a circular area, which is connected to a circuit substrate by a web, which likewise consists of the conductor path film and originates from the edge of the circular area.

11. The tire module of claim 10, wherein the circuit substrate likewise consists of the conductor path film which forms a circular area, and the two circular areas are unitarily connected to one another by the web, coincide in the diameter and subject to the intermediate inserting of a circular spacer disc are arranged on top of one another and coaxially to one another.

12. The tire module of claim 11, wherein the spacer disc on its side facing the piezo disc is convexly curved.

13. The tire module of claim 11, wherein between the spacer disc and the circular area formed by the conductor path film, which faces the piezo disc, a sealing ring is provided.

14. The tire module of claim 12, wherein the components of the tire module, with the exception of a free space between the convex side of the spacer disc and the circular area facing the convex side of the spacer disc and with the exception of the side of the metal disc facing away from the piezo disc, are embedded in an electrically insulating casting compound forming a cast tire module.

15. The tire module of claim 14, wherein the solidified casting compound has a substantially cylindrical circumferential surface.

16. The tire module of claim 15, wherein a cap is provided, which receives the cast tire module and has a flange for connecting the cap to the inside of the tire.

17. The tire module of claim 16, wherein the height of the cast tire module, the cast tire module including the solidified casting compound in which the tire module is embedded, has an oversize with respect to the clear height of the empty cap.

18. The tire module of claim 1, wherein the tire module is disposed within a tub, the tub receiving the components of the tire module including a casting compound.

19. The tire module of claim 18, wherein the tub is molded from a plastic foil.

20. The tire module of claim 18, wherein the tub has a bottom which is so thin that it follows the deformation of the tire transmitting it to the mechanical-electrical transducer, while the latter with rolling tire moves past the contact patch of the tire.

21. The tire module of claim 18, wherein the tub is formed through deep-drawing a foil.

22. The tire module of claim 16, wherein the cap comprises an elastomer material.

23. A pneumatic tire for vehicles, on the inside of which a tire module is fastened, the tire module comprising:

a pressure sensor configured for measuring and/or monitoring the air pressure in the tire;

a transmitter for transmitting radio signals, which contain information regarding the air pressure in the tire, the transmitter connected to the pressure sensor;

a mechanical-electrical transducer with a flexible, circular, disc-like piezo-electric element, which converts alternating changes in shape of the piezo-electric element caused by the rolling tire into electric energy, hereinafter described as a piezo disc, and on which an electrical voltage generated through the piezo effect is tapped off at contact points;

and a storage unit for the electric energy, which is connected to the transducer and powering the pressure sensor and transmitter;

wherein the contact points are located on opposite sides of the piezo disc;

the tire module being fastened to the inside of the pneumatic tire in such a way that a deformation of the inside of the pneumatic tire results in a reversible deformation of the metal disc and of the piezo disc.

24. The pneumatic tire of claim 23, wherein the metal disc contacts the inside of the pneumatic tire with pressure.

25. The pneumatic tire of claim 23, wherein the tire module has, as an integral part, a tub, which receives the further components of the tire module including a casting compound, and wherein the tub has a bottom, which contacts the inside of the tire with pressure.

* * * * *